US009065625B2

(12) United States Patent
Flowers

(10) Patent No.: US 9,065,625 B2
(45) Date of Patent: Jun. 23, 2015

(54) IMPAIRED CARRIER CODING

(71) Applicant: Raytheon Company, Waltham, MA (US)

(72) Inventor: Dale R. Flowers, Sunnyvale, CA (US)

(73) Assignee: Raytheon Applied Signal Technology, Inc., Sunnyvale, CA (US)

( * ) Notice: Subject to any disclaimer, the term of this patent is extended or adjusted under 35 U.S.C. 154(b) by 0 days.

(21) Appl. No.: 13/791,496

(22) Filed: Mar. 8, 2013

(65) Prior Publication Data

US 2014/0254709 A1  Sep. 11, 2014

(51) Int. Cl.
| | | |
|---|---|---|
| H04L 1/00 | (2006.01) | |
| H03M 13/29 | (2006.01) | |
| H03M 13/09 | (2006.01) | |
| H03M 13/19 | (2006.01) | |

(52) U.S. Cl.
CPC ............ *H04L 1/0061* (2013.01); *H04L 1/0057* (2013.01); *H04L 1/0071* (2013.01); *H03M 13/098* (2013.01); *H03M 13/19* (2013.01); *H03M 13/2918* (2013.01); *H03M 13/2963* (2013.01); *H04L 1/0041* (2013.01); *H04L 1/0045* (2013.01); *H04L 1/0066* (2013.01)

(58) Field of Classification Search
CPC ... H04L 1/004; H04L 27/2617; H04L 1/0041; H04L 1/0045; H04L 1/0057; H04L 1/0061; H04L 1/0066; H04L 1/0071; H04L 25/4908; H04L 27/2602; H03M 13/098; H03M 13/19; H03M 13/2918; H03M 13/2963
See application file for complete search history.

(56) References Cited

U.S. PATENT DOCUMENTS

| | | | | |
|---|---|---|---|---|
| 8,320,233 | B2 * | 11/2012 | Razazian et al. | 370/208 |
| 8,614,964 | B1 * | 12/2013 | Vargantwar et al. | 370/252 |
| 2002/0031146 | A1 * | 3/2002 | Abbas et al. | 370/476 |
| 2007/0041458 | A1 * | 2/2007 | Hocevar et al. | 375/260 |
| 2009/0135934 | A1 * | 5/2009 | Guerrieri et al. | 375/262 |
| 2012/0263251 | A1 * | 10/2012 | Djordjevic et al. | 375/261 |
| 2013/0058431 | A1 * | 3/2013 | Fonseka et al. | 375/295 |
| 2013/0216221 | A1 * | 8/2013 | Zhang et al. | 398/43 |

OTHER PUBLICATIONS

International Search Report, dated May 13, 2014, and mailed May 21, 2014, corresponding to PCT/US2014/021429, 3 pages.
Written Opinion of the International Searching Authority, dated May 13, 2014, and mailed May 21, 2014, corresponding to PCT/US2014/021429, 6 pages.
Ayanoglu, "Adaptive ARQ/FEC for Multitone Transmission in Wireless Networks," IEEE vol. 3 Nov. 13, 1995, pp. 2278-2283, XP010164657.

(Continued)

*Primary Examiner* — Hirdepal Singh
(74) *Attorney, Agent, or Firm* — Christie, Parker & Hale, LLP

(57) ABSTRACT

A method of transmitting a plurality of bits via at least two carriers each having a data rate for achieving transmission despite an impaired carrier, the method includes: receiving the plurality of bits for transmission via the at least two carriers; populating the plurality of bits in a N-dimensional bit structure using an aggregation pattern; producing a coded transmit block having N dimensions, a plurality of encoded rows and a plurality of encoded bits by encoding the N-dimensional bit structure; assigning each of the plurality of encoded bits to each of the at least two carriers; and transmitting the plurality of encoded bits via the at least two carriers.

18 Claims, 12 Drawing Sheets

(56) References Cited

OTHER PUBLICATIONS

Robert G. Gallager, Information Theory and Reliable Communication, Wiley, New York, 1968 (cover and pp. 385-390).

John G. Proakis, et al., Digital Communications, 5th ed., McGraw-Hill, New York, 1995 (cover and pp. 919-929).

Todd K. Moon, Error Correction Coding: Mathematical Methods and Algorithms, Wiley, 2005 (cover and pp. 425-433).

* cited by examiner

IMPAIRED CARRIER CODING

CROSS-REFERENCE TO RELATED APPLICATION(S)

This application incorporates the entire contents of U.S. patent application Ser. No. 13/404,279, filed on Feb. 24, 2012.

FIELD

Embodiments of the present invention relate to the field of data communication across multiple channels.

BACKGROUND

In a multicarrier system, the total bandwidth available to the communication system is divided into a number of narrower non-overlapping frequency sub-bands. A high rate data stream is thus divided into separate data streams each associated with a different frequency sub-band. Forward Error Correction (FEC) codes used on single channel communication systems can be readily applied to multicarrier communication systems. However, if interference or equipment failure impairs one of the carriers, the FEC is often unable to correct the resulting bit errors, and the entire multicarrier link is rendered unusable.

What is desired is an FEC configuration for multicarrier communication systems capable of correcting for the impairment of one or more carriers while offering good performance at relatively low complexity.

SUMMARY

Embodiments of the present invention employ a method for selecting a turbo product code (TPC) configuration and mapping encoded data bits into multiple carriers such that the impairment of one or more carriers does not result in bit errors at the decoder output and good bit error rate (BER) versus signal to noise ratio (SNR) performance is achieved under non-impaired carrier conditions. For example, according to one embodiment of the present invention, 4 carriers are used to transmit a 3-dimensional TPC having a (4, 3) simple parity code as a first code dimension, and a (32, 26) extended Hamming code as a second and third code dimension. The resulting solution offers error free communication despite impairment of one carrier while providing a practical code rate of 1/2. The embodiments of this invention offer communication solutions that are resilient to service outages due to impaired carriers without compromising transmission latency, encoder/decoder complexity, data rate, modulation flexibility and BER vs. SNR performance.

Embodiments of the present invention may be used in a variety of applications including, for example, any communication or storage system that combines multiple channels into a single logical stream, where the channels may experience different impairments and/or failures. Examples of such systems may include multichannel satellite modems (e.g. Opportunistic modem (OM)), wavelength division multiplexing (WDM) fiber optic systems, multicarrier wireline modems (e.g. Digital Subscriber Line (DSL)), multicarrier radio frequency (RF) modems (e.g. Orthogonal Frequency Division Multiplexing (OFDM)), storage systems (e.g. Redundant Array of Inexpensive Disks (RAID)), packetized systems (for robustness against packet loss), and military communication systems.

According to one exemplary embodiment of the present invention, a method of transmitting a plurality of bits via at least two carriers each having a data rate for achieving transmission despite an impaired carrier, may include: receiving the plurality of bits for transmission via the at least two carriers; populating the plurality of bits in a N-dimensional bit structure using an aggregation pattern; producing a coded transmit block having N dimensions, a plurality of encoded rows and a plurality of encoded bits by encoding the N-dimensional bit structure; assigning each of the plurality of encoded bits to each of the at least two carriers; and transmitting the plurality of encoded bits via the at least two carriers.

Encoding the N-dimensional bit structure may include: encoding each of the plurality of first rows using a first code, producing a first group of code bits, and appending the respective ones of the first group of code bits to each of the plurality of first rows and encoding each of the plurality of Nth rows using a Nth code producing a Nth group of code bits and appending the respective one of the Nth group of code bits to each of the plurality of Nth rows, wherein the coded transmit block has a first coded length along the first dimension that is less than or equal to the number of the at least two carriers, a Nth coded length along the Nth dimension, wherein each of the plurality of encoded bits is associated with a plurality of coded indices comprising an index1 representing a position of each of the plurality of encoded bits along the first dimension relative to an origin and an indexN representing a position of each of the plurality of encoded bits along the Nth dimension relative to the origin.

Assigning each of the plurality of encoded bits may include: Retrieving each of the plurality of encoded bits by: first retrieving one of the plurality of encoded bits with index1 equal to I-1 and indexN equal to I-N; incrementing the index1 by 1 every time each of the encoded bits is retrieved; and incrementing the indexN when an index immediately preceding indexN exceeds a previous coded length and resetting all of the plurality of coded indices that precede the indexN to 1, until the indexN exceeds the Nth coded length; and assigning each of the plurality of retrieved bits to each of the at least two carriers based on an assignment sequence.

The assignment sequence may be based on at least one of a number of parameters including: the number of the at least two carriers; the data rate of each of the at least two carriers; the number N; and a length of each of the N dimensions.

Assigning each of the plurality of encoded bits may further include: initializing a bit pressure counter of each of the at least two carriers; initializing a bit-from-row counter of each of the at least two carriers; and for each of the N dimensions of the coded transmit block: sequentially identifying a row from the plurality of encoded rows; and for each identified row: sequentially identifying a bit from the plurality of encoded bits; for each identified bit: reinitializing the bit-from-row counter of each of the at least two carriers; augmenting the bit pressure counter of each of the at least two carriers by an amount based on the data rate of each of the at least two carriers; selecting a carrier from the at least two carriers having a highest bit pressure counter and the bit-from-row counter not exceeding a correctable number of bits of the identified row; assigning the bit to the selected carrier; decreasing the bit pressure counter of the selected carrier by a predetermined amount; and incrementing the bit-from-row-counter of the selected carrier; and reinitializing the bit-from-row counter of each of the at least two carriers.

The first code may be any one of an odd-parity code, an even-parity code, a hamming code, or an extended hamming code.

According to one embodiment of the present invention, a method of receiving a plurality of bits from at least two carriers each having a data rate for achieving transmission despite an impaired carrier, may include: sequentially receiving each of the plurality of bits from each of the at least two carriers based on the data rate of each of the at least two carriers, populating a coded receive block having N dimensions with the plurality of bits, identifying a group of code bits along each of the N dimensions; extracting the groups of code bits from the coded receive block producing a N-dimensional bit structure; unpopulating the N-dimensional bit structure using an aggregation pattern applied at a transmitter to populate a N-dimensional bit structure.

Populating the coded receive block may further include: first populating a bit position with index1 equal to I-1, and indexN equal to I-N; incrementing the index1 by 1 every time each of the plurality of bit positions is populated; and incrementing the indexN when an index immediately preceding indexN exceeds a previous coded length and resetting all of the plurality of coded indices that precede the indexN to 1, until the indexN exceeds the Nth coded length.

The method may further include applying soft detection to each of the plurality of bits.

The method may further include applying a soft-in, soft-out decoding process to the plurality of bits.

The soft-in, soft-out decoding process may be substantially similar to any one of a Chase algorithm, Soft output Viterbi Algorithm (SOVA) or Bahl-Cocke-Jelinek-Raviv (BCJR).

The method may further include performing bit error correction based on a plurality of codes applied along each of the N dimensions by a transmitter using the respective group of code bits.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
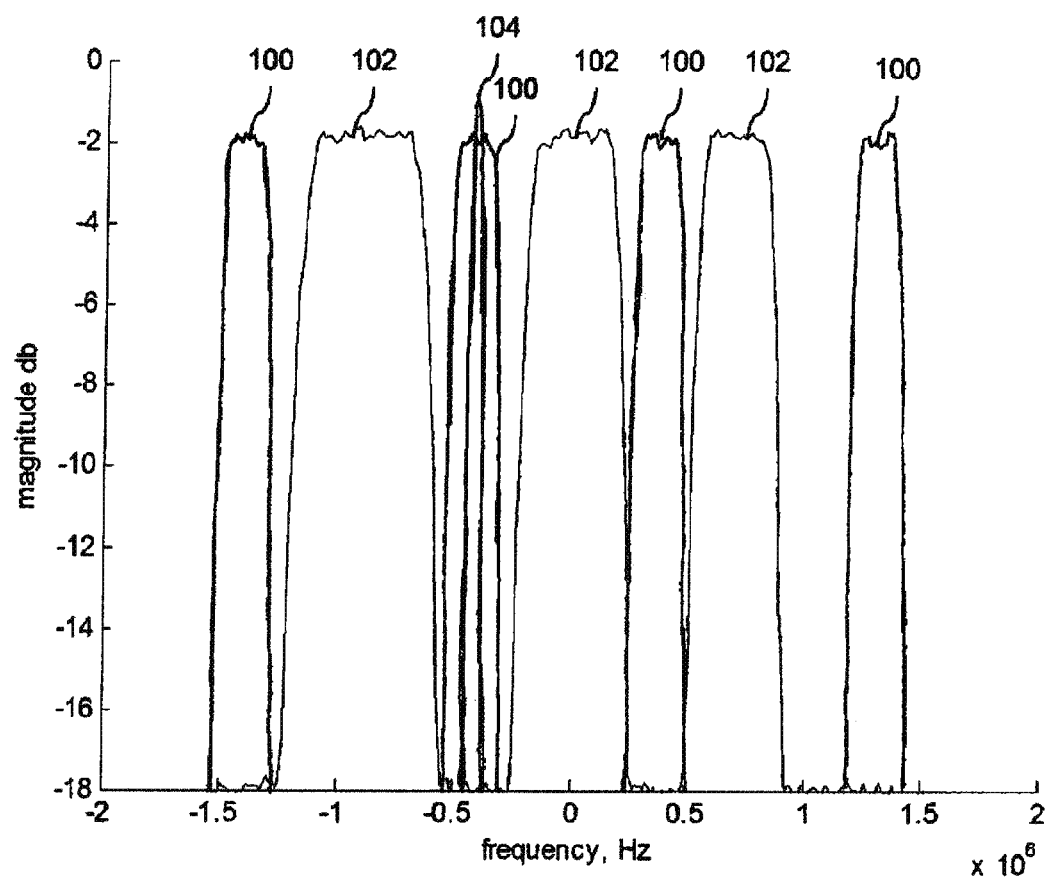
FIG. 1 is an illustration of the spectrum of a multicarrier modem impaired by an interfering carrier.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to a system and a method for matching a multichannel transmission system to a forward error correction code in a manner that makes possible error-free transmission despite significant degradation of one or more channels due some impairment. This method, which involves the favorable selection of the turbo product code (TPC) parameters, the number of carriers, and the method of mapping the bits into those carriers, is referred to as Impaired Carrier Coding (ICC). "Channels," in this context, could refer to radio frequency channels, or to physically separate transmission media such as coaxial cables, fiber optic cables, etc. "Error free" is interpreted to mean that the bit-error rate (BER) is below some threshold, for example, $10^{-7}$ (i.e. less than one out of every 10 million is received in error).

FIG. 1 illustrates an exemplary communication system that exploits four disjointed bands of spectrum to support a single high rate data stream. The signal carriers 100 may share a portion of the frequency spectrum with other unrelated carriers 102. However, an interfering carrier 104 may impede one of the signal carriers 100. Embodiments of the ICC system and method disclosed herein may be implemented to prevent the impairment from causing bit errors in the aggregate received data stream.

Figure 2:
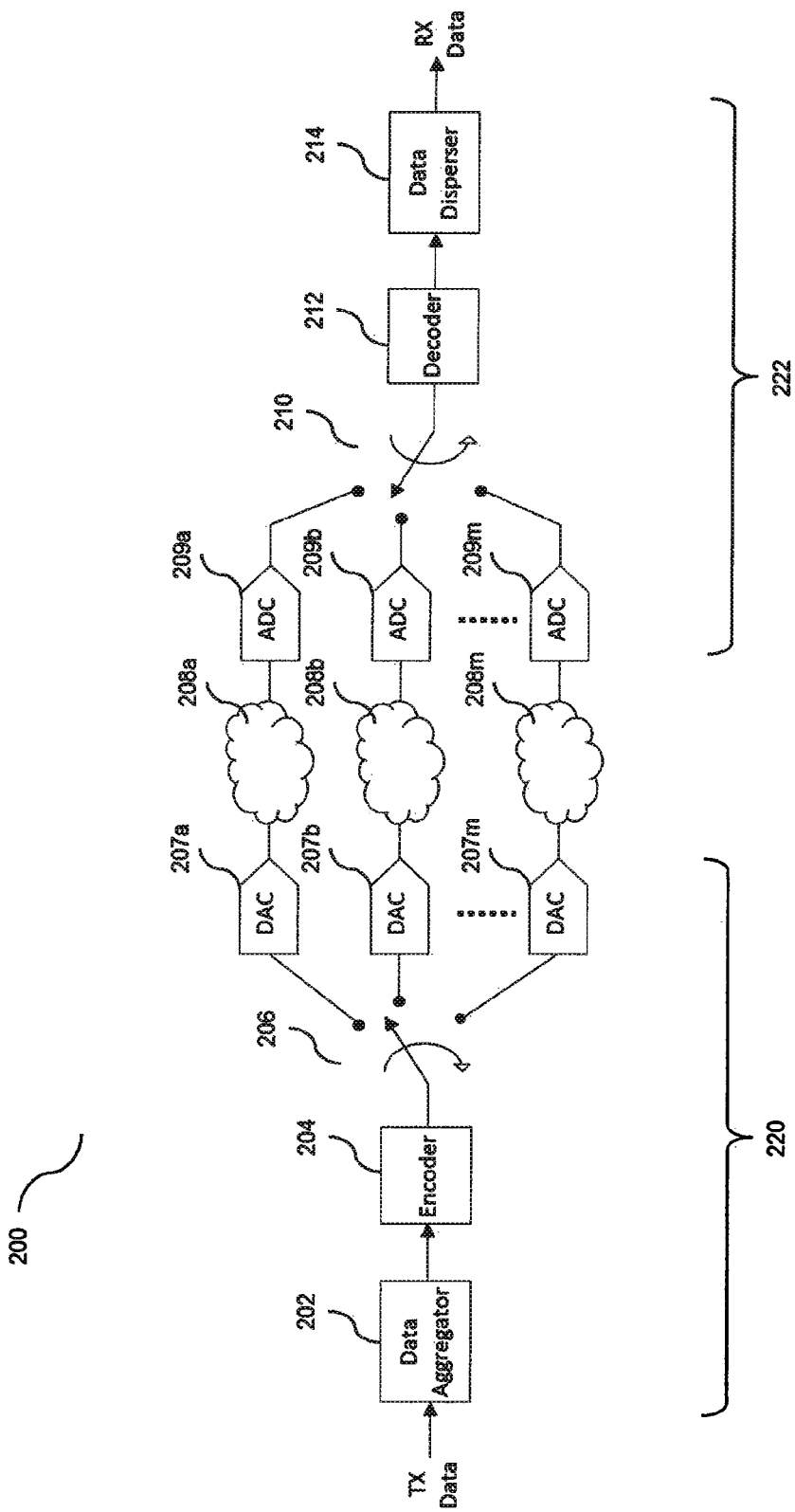
FIG. 2 is a diagram illustrating an exemplary multicarrier transmission system, according to an exemplary embodiment of the present invention.

FIG. 2 is a diagram illustrating an exemplary multicarrier transmission system, according to one exemplary embodiment of the present invention.

In one embodiment, the data aggregator 202 accepts a single input data stream and populates the bits, according to a preset aggregation pattern, in a N-dimensional data structure having rows of preset lengths along each of the N dimensions, where N is an integer greater than one.

The encoder 204 encodes the N-dimensional data structure along each of its N dimensions using a preset coding scheme and adds code bits (or redundancy bits) to the structure along each of its N dimensions. In some embodiments, the preset coding scheme may represent a FEC code or a subclass thereof, such as a turbo product code.

According to one embodiment, the demultiplexer 206 assigns each of the bits of the encoded N-dimensional data structure to each of M carriers 208a-208m (where M is an integer greater than one) according to an assignment sequence, for transmitting the bits across M channels. In one embodiment, the assignment sequence may constitute a fixed repeating assignment pattern represented by, for example, a series of numbers or symbols (e.g. "123412341234 . . . " or "ABCDABCD . . . ") with each number/symbol signifying one of the M carriers. In another embodiment, the assignment sequence may constitute a running algorithm for assigning bits to carriers.

The digital-to-analog convertors (DACs) $207a$-$207m$ (collectively referenced as 207), convert the digital signal bits to analog signals that can be propagated through each of the M channels. The M Carriers $208a$-$208m$ (collectively referenced as 208) transmit the data over M communication channels. In some embodiments, communication channels may include, for example, radio frequency channels, physically separate transmission media such as coaxial cables or fiber optic cables, or the like.

The analog-to-digital converters (ADCs) $209a$-$209m$ (collectively referenced as 209), convert the analog signals from each carrier to digital bit streams. According to some embodiments, the ADCs 209 may apply hard decisions to the incoming signal stream, i.e., comparing the received signal to a threshold and representing each signal above the threshold as a "1" and anything below the threshold as a "0." According to other embodiments, the ADCs 209 may apply soft decisions to the incoming signal stream, which may entail calculating "confidence" or "probability" bits in addition to the "0"s, and "1"s based on a comparison threshold. The confidence bits may provide an indication of how far the signal is from the threshold crossing.

The multiplexer 210 retrieves the data bits from each of the M ADCs 209 and organizes them along a N-dimensional encoded structure according to the preset sequence applied at the demultiplexer 206. The decoder 212 may exploit the redundancy bits built into the structure by the encoder 204 to improve the bit decisions made at the ADCs 209 and to arrive at finalized bit values for each of the retrieved bits from the M carriers 208. In some embodiments, the decoder 212 may use the ADCs confidence bits to employ an iterative soft-in-soft-out (SISO) algorithm to each of the rows of N-dimensional coded structure along each of its N dimensions for improving the soft decisions made by the "soft" ADCs 209. The data disperser 214 unpopulates the coded structure according to the aggregation pattern employed at the aggregator 202 on a first-in-first-out (FIFO) basis.

According to some embodiments, the data aggregator 202, encoder 204, and demultiplexer 206 may comprise a transmission modem, such as the Opportunistic Modem (described in U.S. patent application Ser. No. 13/404,279) and may each or in combination be implemented via firmware (e.g. an application-specific integrated circuit), hardware, or a combination of software, firmware, and hardware. Similarly, according to some embodiments, the decoder 212 and data disperser 214 may each or in combination be implemented via firmware, hardware, or a combination of software, firmware, and hardware.

A person of ordinary skill in the art will recognize that while not included in the multi-carrier system 200 of FIG. 2 for purposes of simplicity of illustration, some embodiments of the present invention may include blocks serving randomization, framing, and modulation functions, as well as others, which may be necessary to facilitate the transmission of data over multiple channels.

Figure 3:
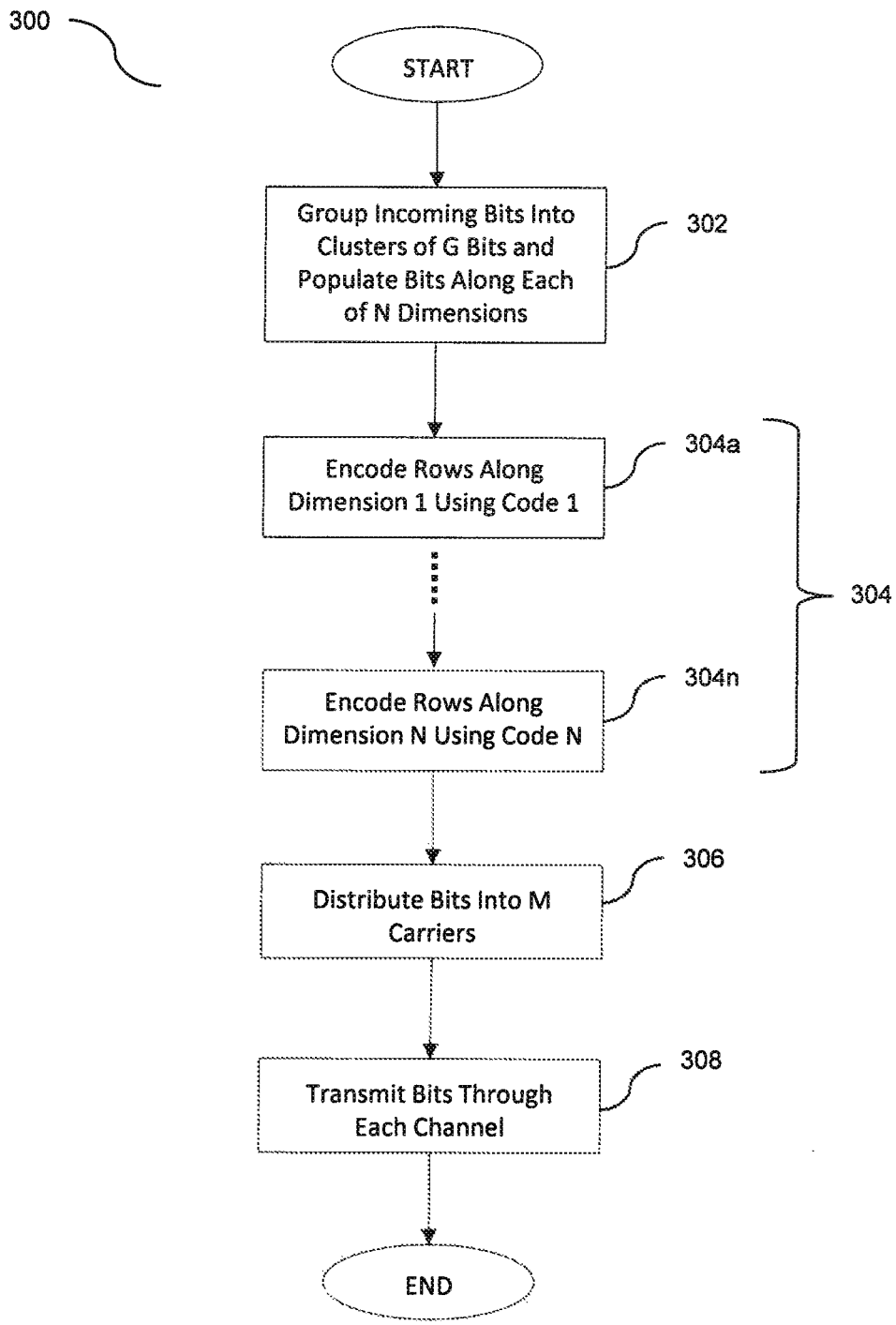
FIG. 3 is a flowchart illustrating a method of encoding and transmitting bits using an ICC transmitter, according to an exemplary embodiment of the present invention.

FIG. 3 is a flowchart illustrating a method of encoding and transmitting bits using an ICC transmitter, according to one embodiment of the present invention. This and other following processes may be described in terms of a software routine executed by one or more processors based on computer program instructions stored in memory. A person of skill in the art will recognize, however, that the process may be executed via hardware, firmware (e.g. via an ASIC), or in combination of software, firmware, and/or hardware. Furthermore, the sequence of steps of the process is not fixed, but may be altered into any desired sequence as recognized by a person of skill in the art.

The process starts and in step 302, the data aggregator 202 groups the stream of incoming bits into clusters of G bits (where G is a positive even integer) and populates the bits of an N-dimensional structure/array (having G elements) with the G bits according to a preset aggregation pattern. The particular order of the bits in the N-dimensional structure may be unimportant so long as the same aggregation pattern is applied at both the transmitter 220 and receiver 222.

In step 304 the data encoder 204 applies a FEC code to the N-dimensional structure. FEC codes are often used in telecommunication, information theory, and coding theory, for detecting and correcting errors in data transmission over unreliable or noisy communication channels. A subclass of FEC codes, block codes, work by using an error-correcting code (ECC) to add redundancy bits to a block of data that a receiver can use to correct transmission errors without needing to request retransmission of data. According to an embodiment of the invention, the encoder may employ a turbo product code, a powerful class of block FEC codes.

TPCs derive their coding strength in part from the large block size (typically thousands of bits). The large block size renders traditional decoding techniques (for example, syndrome decoding) infeasible. However, the structure of turbo product codes lends itself to repeated application of relatively simple decoding algorithms which are well suited to hardware implementation.

TPCs are typically structured as multidimensional structures such as two-dimensional (2D) rectangles or three-dimensional (3D) rectangular solids. In step 304a, the encoder 204 encodes each of the rows along the first dimension using the same (relatively simple) one-dimensional code and appends code bits at the ends of each of the rows. In subsequent steps through step 304n, the encoder 204 repeats the process of step 304a for each of the remaining N dimensions each time applying a one-dimensional code to the rows along a given dimension and appending corresponding code bits to the end of each of the rows. The resulting encoded N-dimensional structure now contains Z bits.

According to some embodiments, each of the TPC codes used in steps 304a-304n (collectively referenced as 304) may be any one of simple parity, triple modular redundancy, perfect Hamming (e.g. Hamming(7, 4)), extended Hamming (e.g. SECDED), perfect binary Golay code, extended binary Golay code (e.g. TECFED), a Bose, Chaudhuri, Hocquenghem (BCH) code, or the like.

In step 306, the demultiplexer 206 distributes the Z bits of the coded N-dimensional structure to the M carriers according to an assignment sequence, which may be, in part, based on the number of carriers, the bitrate of each of the M carriers, the number of dimensions (N) and each of the N dimensions. In step 308, the M carriers transfer the distributed data to the receiver.

Figure 4:
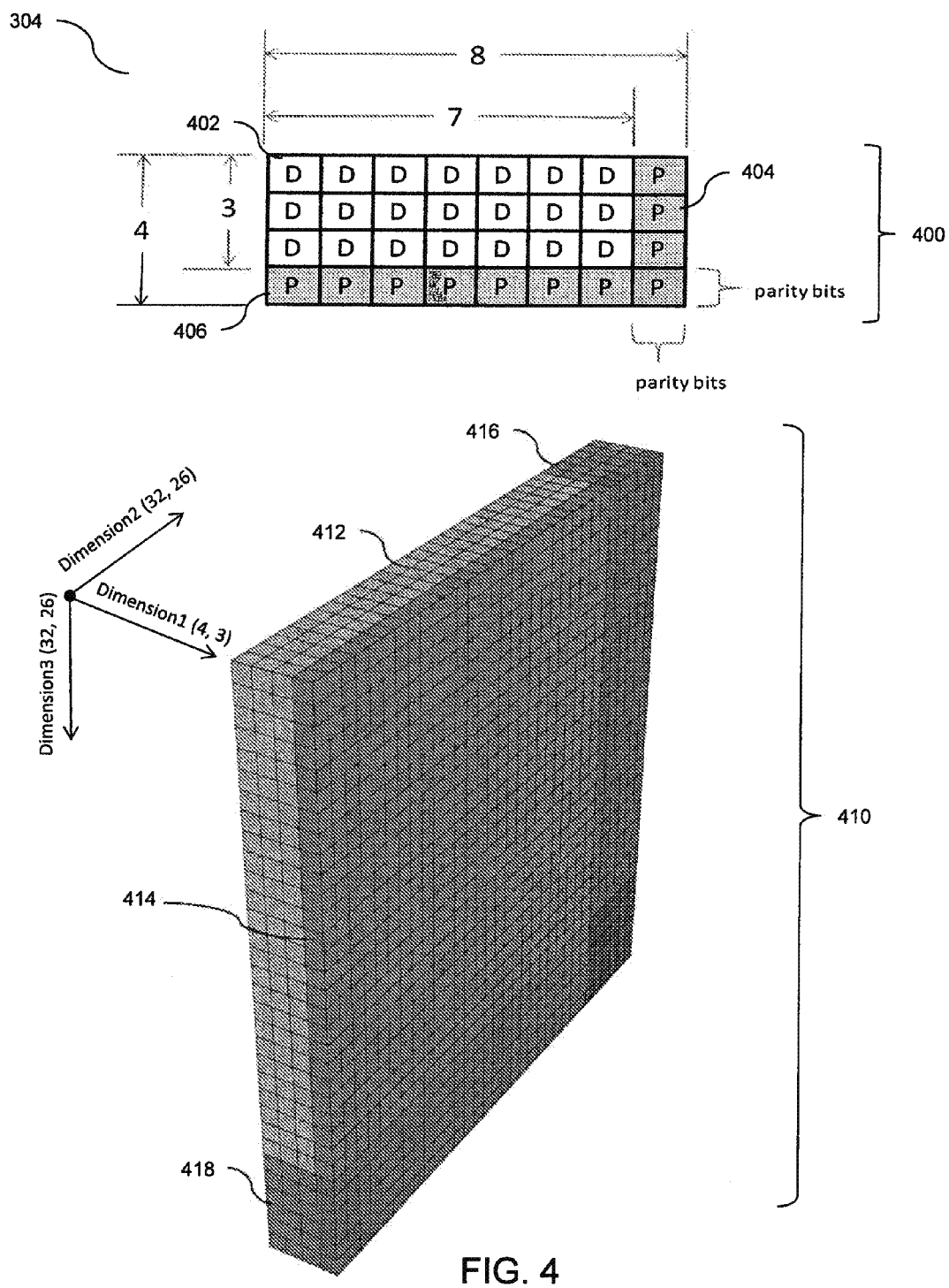
FIG. 4 is a visualization of a process for encoding a 2-dimensional and 3-dimensional structure, according to an exemplary embodiment of the present invention.

FIG. 4 is a visualization of the step 304 of FIG. 3 for encoding a two-dimensional and three-dimensional structure, according to an exemplary embodiment of the present invention. The exemplary 2D structure 400 comprises a 3×7 grouping of incoming data bits 402, which has been encoded along each of its rows and its columns using a simple parity code, and the resulting code bits 404 and 406. The simple parity code used may be either even parity or odd parity.

While every row along each one of the dimensions is encoded using the same code, the codes used for one dimension, generally, need not be the same as any of the other dimensions. Bits 404 and 406 represent the code bits or "redundancy" bits appended to the rows and columns of the 3×7 structure, respectively, as a result of the codes applied to each of the rows and columns. The exemplary 3D structure 410 comprises a 3×26×26 grouping of incoming data bits 412, which has been encoded along each of its three dimensions, as well as the redundancy bits 414, 416, and 418 appended to the rows along each of dimensions 1, 2, and 3, respectively. In the exemplary structure 410, simple parity is used along dimension 1, while a (32, 26) extended hamming code is applied along dimensions 2 and 3.

Arrays 400 and 410 demonstrate the propriety of describing such a code as "product" code since the codeword size, the code rate and the minimum Hamming distance of such codes are the product of respective quantities for the one-dimensional constituent codes. For example, the 2D TPC 400 has a (8, 7) simple parity code applied along dimension one with a word size of 8, code rate of 7/8=0.875 and a minimum Hamming distance of 2. The (4, 3) simple parity code applied to rows along dimension 2 has a codeword size of 4, code rate of 3/4=0.75 and a minimum Hamming distance of 2. The resulting 2D TPC has a codeword size of 8×4=32, coderate of 7/8×3/4=21/32, and a minimum Hamming distance of 2×2=4. Similarly the 3D TPC 410 has a codeword size of 4×32× 32=4096, a code rate of 3/4×26/32×26/32=0.495 and a hamming distance of 2×4×4=32

As the examples above illustrates, it may be stated generally that the largest code rate for the constituent code of length C is (C-1)/C. This corresponds to C-1 data bits, 1 parity bit and C bits total. (A simple parity code has this property.) If C is 4, the largest code rate for the first code dimension is therefore 3/4. Additionally, the overall code rate for the TPC is the product of the individual constituent codes for each dimension. So, the overall code rate can never exceed the code rate of any one dimension. Further, as the code rate of each dimension needs to be significantly less than 1 to provide any significant benefit, the overall code rate will be significantly less than the code rate of any one dimension.

Figure 5A:
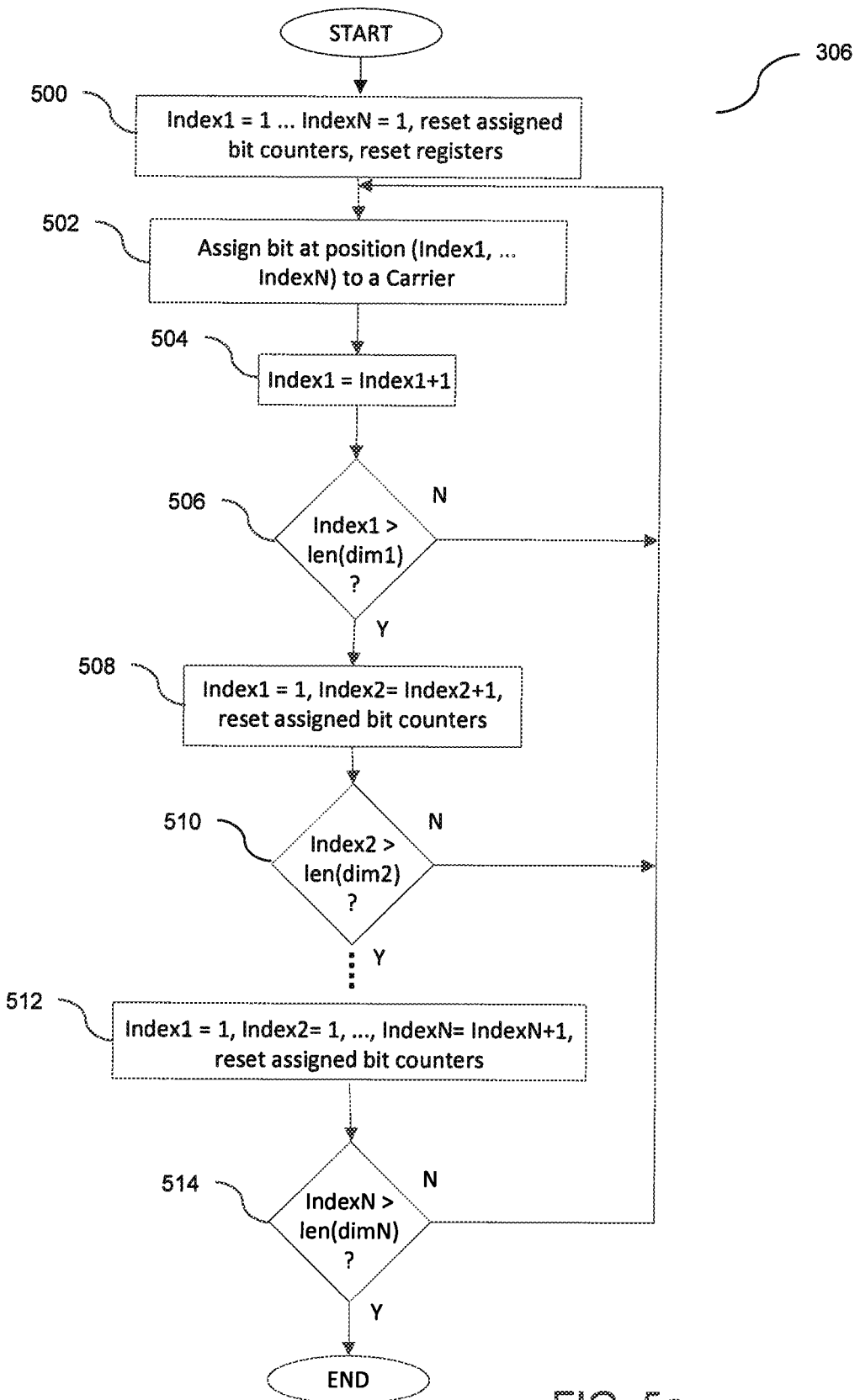
FIG. 5a is a more detailed flow diagram of a process for distributing the bits of the encoded N-dimensional structure into the M carriers, according to an exemplary embodiment of the present invention.

FIG. 5a is a more detailed flow diagram of step 306 of FIG. 3 for distributing the bits of the encoded N-dimensional structure into the M carriers, according to one exemplary embodiment of the present invention. In this embodiment, the location of every bit within the encoded N-dimensional structure is represented with a plurality of indices, index1 through indexN, representing each of dimensions 1 through N, respectively. In this example, N is an integer greater than two, however, in other embodiments, N may also be equal to two. Each dimension may have an associate number of correctable bits (NCB) that is dependent on the length of the dimension and the TPC code applied to the rows along the dimension. For example, a Hamming (7, 4) code applied along a dimension with row size of 7 bits has an NCB equal to 2. Additionally, each of M carriers may be associated with a number of bits per symbol NBPS (which may be representative of the data carrying rate of the carrier). For purposes of this example, it may be useful to define two sets of counters: $R_i$ and $C_i$ ($1 \leq i \leq M$), where R, represents a register that connotes a "bit pressure" associate with a corresponding carrier and $C_i$ represents the number of bits from a row that has been assigned to a corresponding carrier. Further, the variable Nt may be defined as the sum total of all $NBPS_i$ (where $1 \leq i \leq M$) to represent the total number of bits per symbol of all carriers.

In step 500, all bit indices are initialized to 1, and the set of $R_i$ and $C_i$ ($1 \leq i \leq M$) counters are initialized to zero. In step 502, the demultiplexer 206 assigns the bit at location [index1, . . . , indexN] of the N-dimensional structure to one of the M carriers according to an assignment sequence. In step 504, index1 is incremented by one and in step 506, the index is compared to the length of the structure along dimension one (length1). If the index does not exceed length1 (i.e. not every bit from the row has been assigned), the process repeats at step 502, otherwise, the process proceeds to step 508 where index 1 is reset to 1 and the next index, index2, is incremented by one (i.e. proceeds to the next row). Additionally, in step 508, the set of $C_i$ ($1 \leq i \leq M$) counters are initialized to zero. In step 510, index2 is compared to the length of the structure along dimension two (length2). If index2 does not exceed length2, the process repeats at step 502, otherwise index1 and index2 are reset to 1 and the next index, index3, is incremented by one. This pattern continues for each successive index through indexN. In step 512, all indices preceding indexN are reset to 1 while indexN is incremented by one. Further, in step 512, the set of C, ($1 \leq i \leq M$) counters are initialized to zero. In step 514, if indexN is greater than length of the structure along dimension N (i.e. all bits have been assigned), the process ends. Otherwise, the process restarts at step 502.

According to another embodiment of the present invention, the starting position for reading bits from the N-dimensional structure and assigning to one of the M carriers can be a position other than [1, . . . , 1]. In step 500, the N indices may be initialized to a set of preset integers that are greater than one. However, in such an embodiment, process 306 may be modified such that in step 514, if the IndexN is greater than the length of the structure along dimension N, all indices may be set to "1" and the process 306 is continued until all bits from position [1, . . . , 1] to the starting location have been assigned to one of the M carriers according to the assignment sequence. This would ensure that every bit from the N-dimensional structure is assigned to a carrier.

Figure 5B:
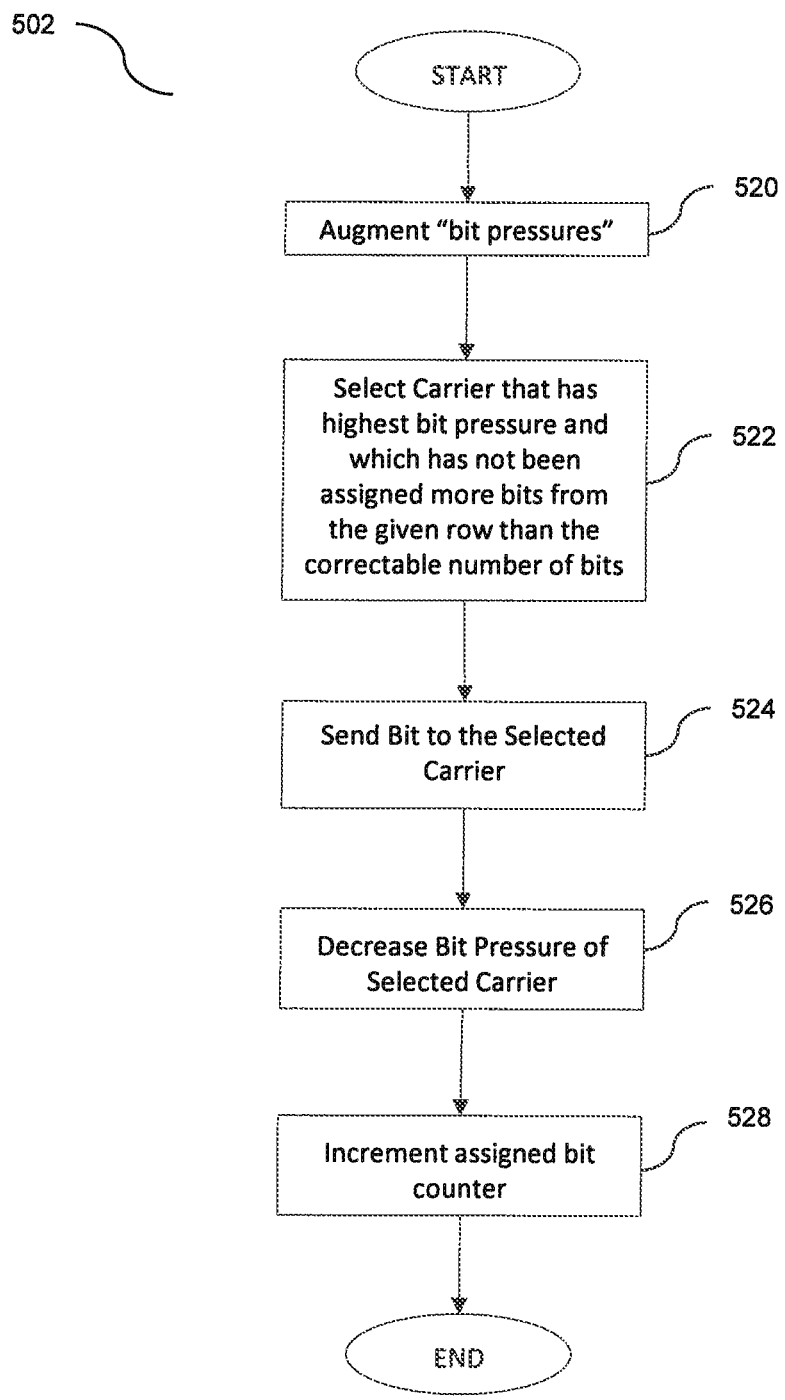
FIG. 5b is a more detailed flow diagram of a process for assigning a bit to a carrier, according to an exemplary embodiment of the present invention.

FIG. 5b is a more detailed flow diagram of step 502 of FIG. 5a for assigning a bit to a carrier, according to an exemplary embodiment of the present invention. In step 520, the bit pressure for each carrier is incremented by the number of bits per symbol for that carrier, i.e., for every index i from 1 to M, $R_i=R_i+NBPS_i$. In step 522, a carrier (with index i=x) may be selected that has the highest bit pressure (maximum R) and which has been assigned fewer bits from the current row than is correctable by the code applied to the row (i.e. $C_x$<NCB of that row). According to one embodiment, in step 522, if two or more carriers are tied as having the highest bit pressures, the carrier that has the lowest index i (where $1 \leq i \leq M$) is selected. A person of ordinary skill in the art will recognize that the choice of a carrier as the tie breaker is arbitrary and any other criteria may be defined for choosing among tied carriers, such as choosing a carrier with the highest index. In step 524, a bit in position (index1, indexN) is assigned to selected carrier. In step 526, the bit pressure of the selected carrier is reduced by the value Nt (Rx may assume a negative value as a result). In step 528, C, is incremented by 1.

The assignment sequence described by the algorithm of step 502 of FIG. 5b as well as the manipulations of counter and register values in steps 500, 508, and 512 of FIG. 5a, may also be expressed using the following C-coded function:

```
/* function getNextCarrierIdx( ) performs the bit assignment to carriers */
int getNextRow(int *carrierIndices)
{
int jj, kk;
int maxPressure;
int maxIdx;
int C[MAX_CARRIERS];   // number of assignments of each carrier
for (jj = 0; jj < number_of_carriers; jj++)
```

-continued

```
    assignments[jj] =0;
for (kk = 0; kk <dimension1_length; kk++)
{
    /* update the bit pressure (R) for all carriers */
    for (jj = 0; jj < numCar; jj++)
        R[jj] += bitsPerCarrier[jj];
    /* find the carrier with the maximum bit pressure, subject to the
    constraint that it hasn't already received the maximum number of
    correctable bits in this row. */
    maxPressure = -1000;
    for (jj = 0; jj < number_of_carriers; jj++)
    {
        if((R[jj] > maxPressure) && (C[jj] < NCB))
        {
            maxPressure = R[jj];   // we found a new best one
            maxIdx = jj;
        }
    }
    /* Crash protection in case we couldn't find ANY carrier to use */
    if (maxIdx < 0)
        maxIdx = 0;
    /* Send the next input bit to the carrier with the maximum bit
    pressure */
    carrierIndices[kk] = maxIdx;
    C[maxIdx] += 1;
    /* Relieve the bit pressure for the selected carrier */
    R[maxIdx] = R[maxIdx] - Nt;
}
/* Check whether carriers are being given bits in the proper ratios. If not,
it implies that no ICC solution exists for the specified configuration */
for (jj = 0; jj < number_of_carriers; jj++)
    if((R[jj] > Nt) || (R[jj] < -Nt))
return 1;
/* If we haven't returned yet, all bit pressures are OK. Indicate success */
return 0;
}
```

According to one embodiment of the present invention, rather than perform the assignment algorithm described above in real time for an incoming data stream, the algorithm may be used to generate a fixed repeating assignment pattern (as, e.g., represented by "1234512345 . . . " for M=5) and, during operation, the assignment pattern may be employed in assigning bits to carriers in step 502. This approach may result in lower operating computation complexity and thus a simpler transmitter 220 hardware/software design. In this embodiment, the assignment pattern may be generated by applying the ICC design parameters (such as number of carrier, the data rate of each carrier, the number of dimensions (N), the number of correctable bits of each row of the N-dimensional coded structure) to the assignment algorithm of steps 500, 502, 508, and 512 of FIG. 5a and recording the bit assignments in the form of a, for example, number sequence. For instance, for the exemplary ICC systems of FIG. 4 with four carriers having identical data rates, a simple assignment pattern may be "123412341234 . . . ," where the number in each position corresponds to a carrier to which the bit in that position is assigned. That is, the first bit that is retrieved according to step 306 is assigned to carrier 1, the second to carrier 2, the third to carrier 3, the fourth to carrier 4, the fifth to carrier 1 and so forth. Similarly, an assignment pattern for an ICC system employing 4 carriers to convey a 2D encoded block with a first row having a length of 3 may be, for example, "1234212342 . . . ," where the second carrier has twice the data rate of the other three carriers.

FIG. 5a is an illustration of the process 306 of FIG. 3 applied to a 4×8 2D code block, according to one embodiment of the present invention. For purposes of simplicity of illustration, it is assumed that the exemplary ICC system has four carriers each of which have the same data transmission rate. In this example, the first bit that is read and assigned to a carrier is bit "0" in the upper left corner of structure 400, which marks position [index1=1, index2=1]. Index 1 is incremented by one and bit marked "1" is read and assigned to the next carrier according to a assignment sequence of "12341234 . . . ," where each number represents a carrier. The process repeats with each consecutive bit being assigned to the next carrier according to the assignment pattern until index1 exceeds 4, the length of the structure 400 along dimension1, at which point index1 is reset to 1, and the next index, index 2 is incremented by one and the process is repeated again. In this manner, the rows along dimension 1 are read out top to bottom, proceeding from the left row to the right row.

In this example, each carrier receives all of the bits from one of the rows 600, 602, 604, and 606 of the 4×8 encoded TPC block 400. If, under the influence of noise, crosstalk, or other impairment inducing effects, one of the channels of the ICC system, for example, channel 2 (carrying bits of row 602), is completely impaired, the ICC system may still be able to recover all lost data. While the second row of the block suffers 8 bit erasures and this far exceeds the error correcting capability of the (8, 7) simple parity code used along dimension 2, the redundancy introduced by the dimension1 parity bits is adequate to recover bits of row 602 provided that the location of the unreliable bits are known and all other bits are received correctly. In this manner, the loss of one carrier doesn't bring down the entire multicarrier link.

The ability of the ICC system to correct for carrier impairments may be limited, in part, by the type of code applied to the rows parallel to the first dimension and the number of resulting redundancy bits. In the example of FIG. 5a, the (4, 3) simple parity code may accomplish correction of a single bit via the following:

At the encoder 204, the value of the parity bit (0 or 1) is calculated to make the total number of 1's in the codeword an even number (for even parity) or an odd number (for odd parity). At the decoder 212, the number of 1's in the received codeword is determined. For hard decision inputs (where every received bit is represented as a 0 or a 1), the decoder can detect the existence of a single bit error but it cannot correct it, because there is no means of determining which bit is in error. However, in the case of a single bit erasure (where one of the bits is believed to be unreliable), that bit can simply be regenerated in order to make the overall parity be even (if even parity is in use) or odd (if odd parity is in use). Therefore, regardless of which bit is erased, the correct codeword can be recovered provided that all of the other bits are received correctly. This argument can be extended to the soft decision case. For soft decisions the "erasure" concept is replaced by some finer-grained measure of bit confidence but the result is the same; a single unreliable bit can be recovered by using bit confidence information as well as knowledge of the structure of the code.

FIG. 5b is an illustration of process 306 of FIG. 3 applied to the 4×32×32 three-dimensional TPC code block 410, according to one embodiment of the present invention. As before, for purposes of simplicity of illustration, it is assumed that the exemplary ICC system has four carriers each of which have the same data transmission rate. In this example, even though carrier 3 is impaired and its bits have suffered complete erasure, the (4, 3) simple parity code may able to recover the erased bits (one per row).

FIG. 5c is an exemplary illustration of process 306 of FIG. 3 where the carriers of the multicarrier system have dissimilar data rates, according to one embodiment of the present invention. In this example, carrier 4 has a data rate that is twice that of the other three carriers. In this example, process 306 of FIG. 3 is applied to assign the bits of the 4×8 TPC block to the four carriers according to the assignment sequence of "123441234412344 . . . ". As in the examples above, if each of the carriers 1, 2, or 3 is impaired, error free operation may be possible. However, if carrier 4 is impaired, most rows along dimension 1 will suffer two bit erasures. Because a (4, 3) simple parity cannot correct two bit erasures, error free operation is therefore not possible.

Therefore, it may generally be stated that, error free operation may be possible when the data rate of the each carrier is equal to or less than the total data rate of all carriers multiplied by the number of correctable bits along dimension 1, divided by the length of the first dimension of the code. In more formulaic terms, the ICC criteria may be expressed as:

For each index i from 1 to M: $\text{CarrierDataRate}_i \leq \Sigma \text{CarrierDataRate}_i \times \text{NCB}_{dimension1} / \text{length}_{dimension1}$.

In the above example, each of carriers 1-3 has a bit rate of 1 while carrier 4 has bit rate of 2. Carriers 1-3 are each conveying 1/5 of the total bit rate. This is less than the 4-carrier ICC criteria of 1/4. Carrier 4, however, is conveying 2/5 of the total bit rate. This exceeds the ICC criteria. Therefore, error free operation is possible if either carriers 1-3 is impaired, but not if carrier 4 is impaired.

Figure 6A:
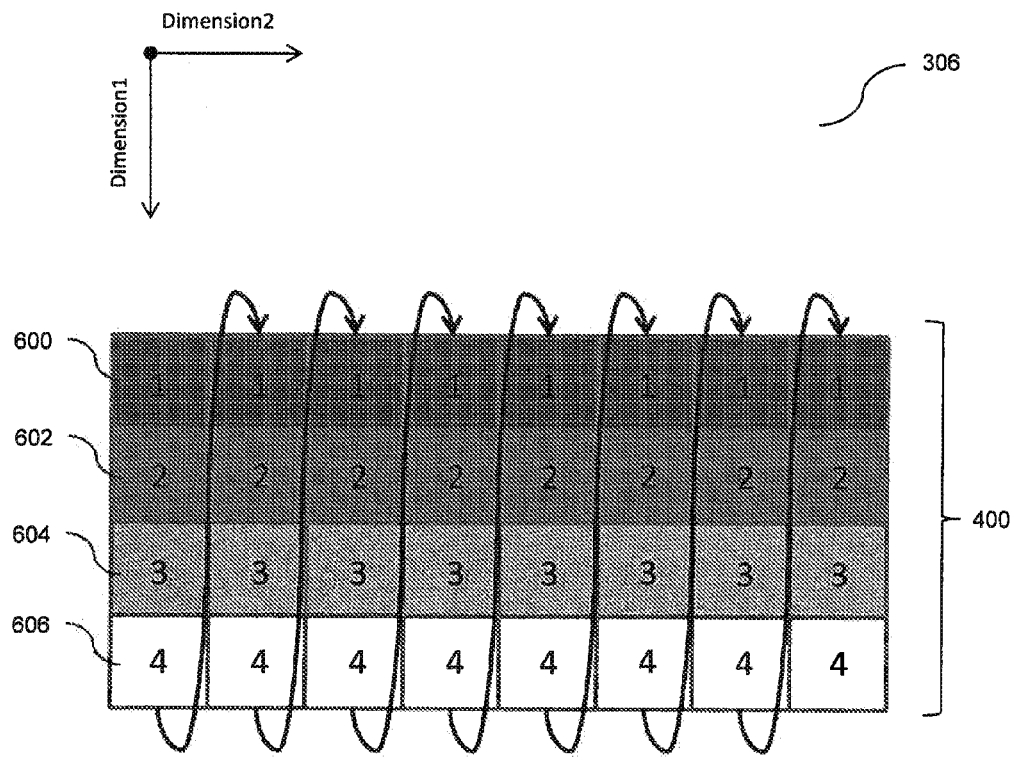
FIG. 6a. is an illustration of a process for assigning bits of a 4×8 two-dimensional code block to four carriers, according to an exemplary embodiment of the present invention.
Figure 6B:
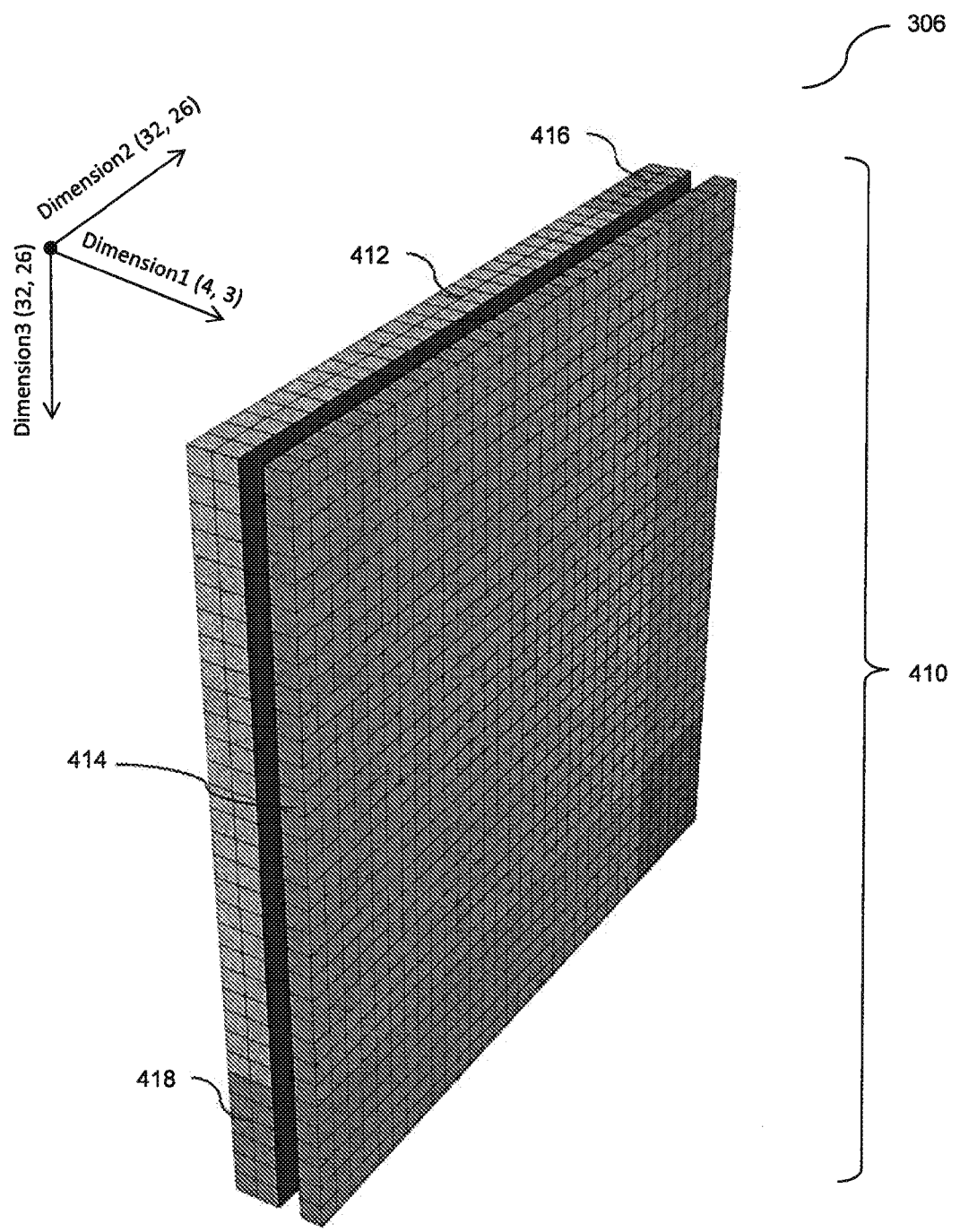
FIG. 6b is an illustration of process for assigning bits of a 4×32×32 three-dimensional TPC code block to four carriers, according to an exemplary embodiment of the present invention.
Figure 6C:
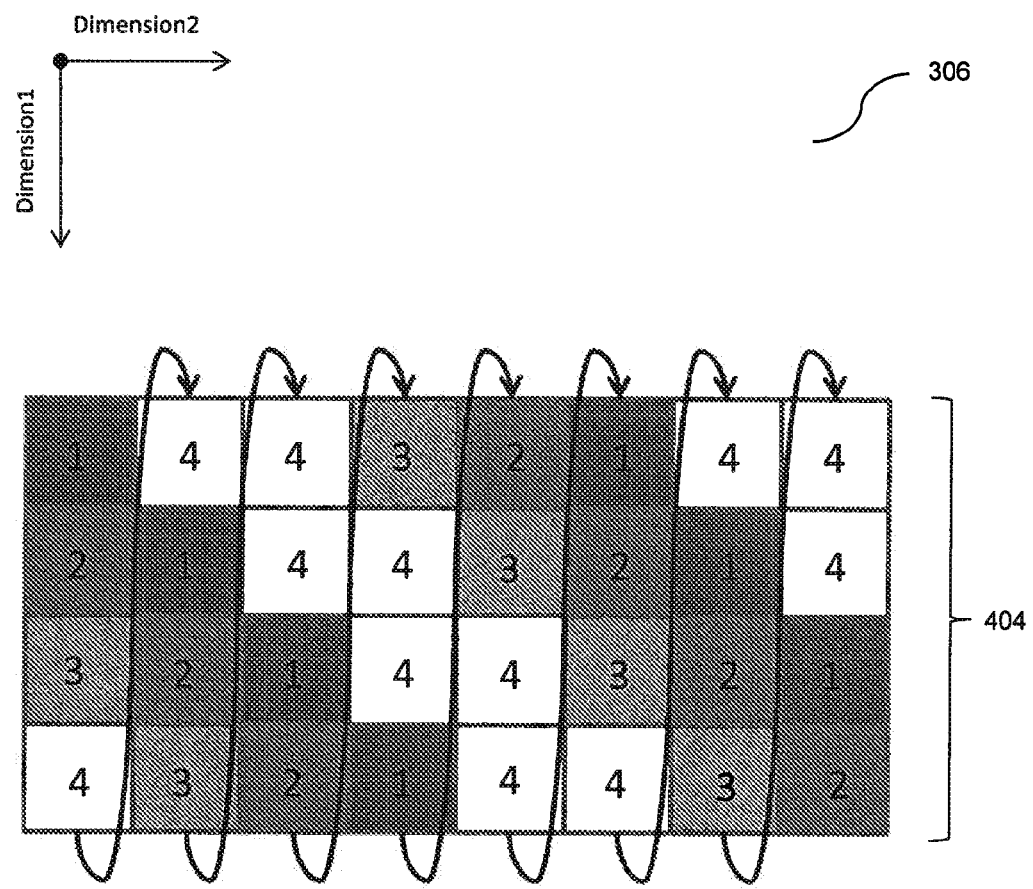
FIG. 6c is an exemplary illustration of a process for assigning bits to four carriers where the carriers of the multicarrier system have dissimilar data rates, according to one embodiment of the present invention.

The discussion above has been primarily focused on protecting against the loss of a single carrier. However, this is not a limitation of ICC per se but rather a limitation of the constituent one-dimensional code used for the first dimension of the TPC. According to an exemplary embodiment, if a constituent code with minimum distance 4 is applied to the first dimension, then up to two impaired carriers may be tolerated. For example, if the (4, 3) simple parity code of the 4×32×32 TPC of FIG. 6b is replaced by a (8, 4) or (16, 11) extended Hamming code, the resulting code may be capable of tolerating the loss of up to two carriers. It should be noted, however, that this code may require at least 8 or 16 carriers, respectively, in order to have ICC properties. According to another embodiment, protection against the loss of three or more carriers may also be possible; assuming a constituent code of sufficient Hamming distance is available.

Figure 7A:
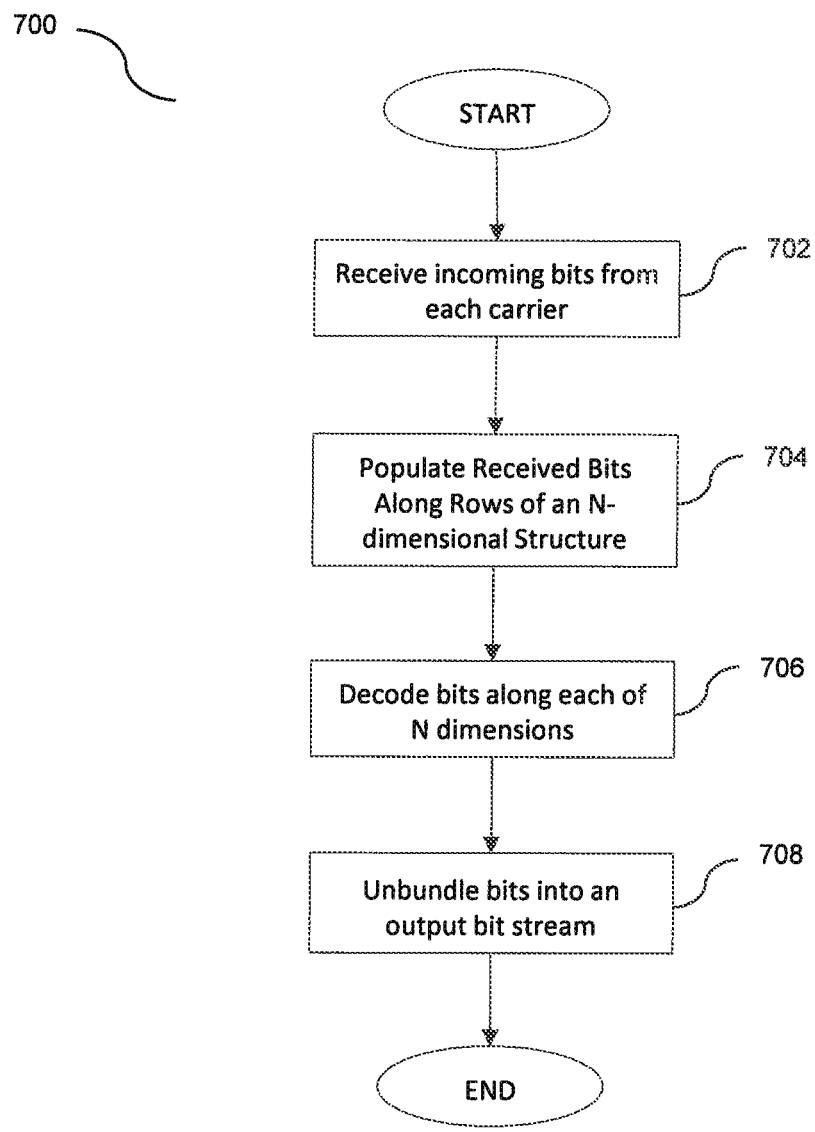
FIG. 7a is a flow diagram chart illustrating a method of receiving and decoding bits using an ICC receiver, according to one exemplary embodiment of the invention.

FIG. 7a is a flow diagram 700 illustrating a method of receiving and decoding bits using an ICC receiver, according to one exemplary embodiment of the invention. The process starts and in step 702, the ADCs 209 receive the signals from each of the M carriers 208. According to one embodiment, the ADCs 209 may apply hard detection and represent each of the received bits as a '0' or '1'. In another embodiment, the ADCs 209 may apply soft decisions to the received signals and append each detected '0' or '1' with confidence data.

In step 704, the multiplexer 210 retrieves the detected bits from each of the M ADCs 209 and organizes them according to the same assignment sequence employed at the transmitter 220. According to one embodiment, the assignment sequence may comprise an assignment pattern (as, e.g., represented by "1234512345 . . . " for M=5). According to another embodiment, the multiplexer 210 may apply an algorithm substantially similar to the algorithm of steps 500, 502, 508, and 512 of FIG. 5a in organizing the received bits into an N-dimensional structure (of equal size to the N-dimensional structure arrived at the end of step 304 of FIG. 3).

In step 706, the decoder 212 uses the redundancy bits of each of the rows of the recreated N-dimensional structure to correct for any bit errors that may have resulted from noise, crosstalk, or other impairments corrupting the signals during transmission and/or detection. According to one exemplary embodiment, in step 706, the decoder may apply a soft-in, soft-out algorithm to each of the rows of the N-dimensional structure to improve the error correcting capability of the ICC system. The decoder 212 then strips the code bits from each of the rows of the coded N-dimensional structure to arrive at an N-dimensional structure that has a total of G bits.

According to one embodiment, the SISO decoding process of step 706 may comprise applying an algorithm substantially similar to any one of the Chase algorithm, the Soft output Viterbi Algorithm (SOYA), the BCJR algorithm, or the like.

In step 708, the data disperser 214 unpopulates the G bits according to the aggregator pattern applied at the aggregator 202 in step 302 of FIG. 3, and produces an output data stream.

Figure 7B:
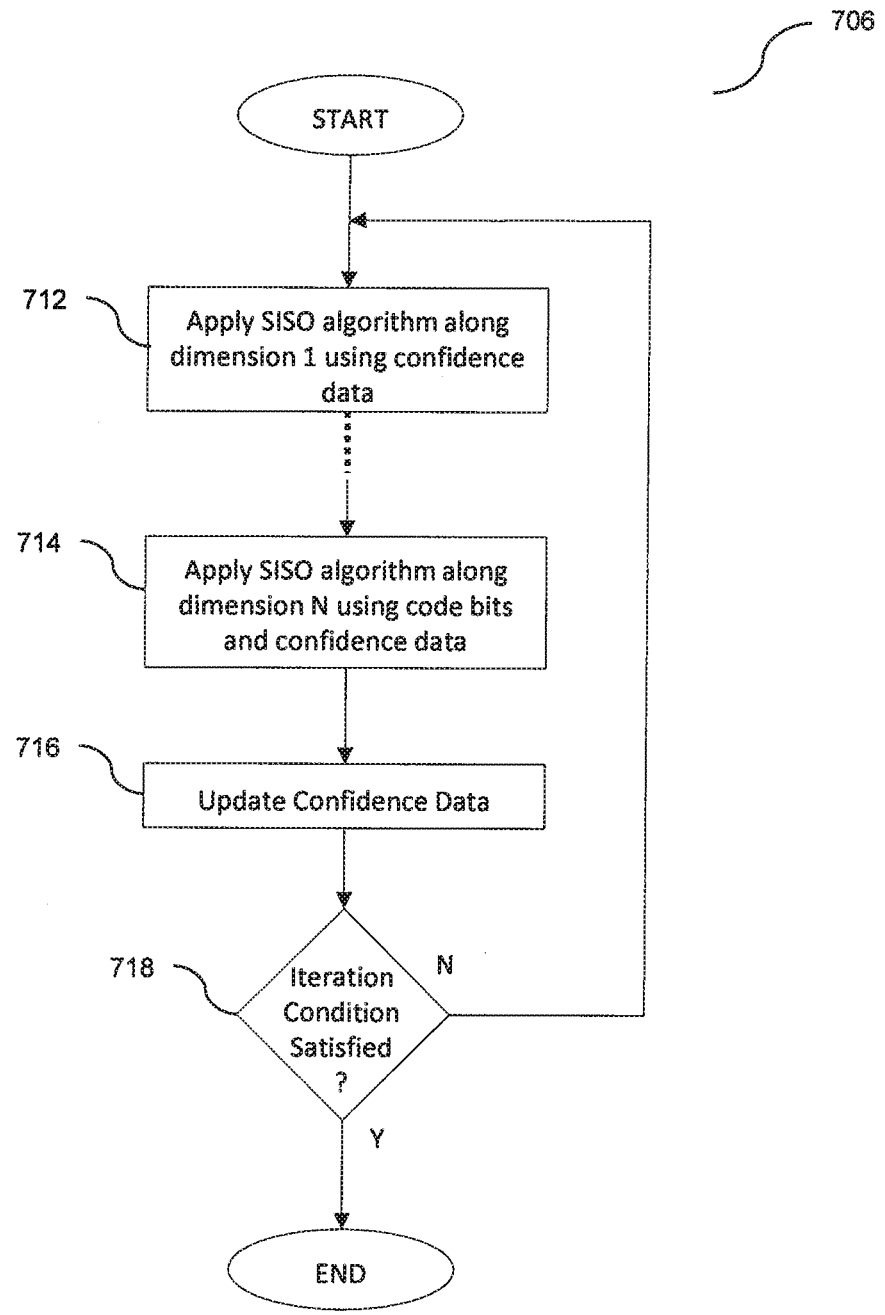
FIG. 7b is a flow diagram of a process for decoding the bits of the recreated N-dimensional structure using an iterative soft-in, soft-out algorithm, according to an exemplary embodiment of the present invention.

FIG. 7b is a more detailed flow diagram of step 706 of FIG. 7a for decoding the bits of the recreated N-dimensional structure using an iterative SISO algorithm, according to an exemplary embodiment of the present invention.

According to this example, soft-decision ADCs 209 at the receiver 222 produce "confidence" or "reliability" information regarding each of the detected bits. In step 712, the decoder 212 applies a decoding algorithm to each of the rows along dimension 1 of the N-dimensional TPC block. This decoding algorithm does not make final bit decisions; it simply exploits the redundancy (code bits) in each row in turn to improve the soft decisions in that row. The decoder repeats this process for each of the rows along the remaining N-1 dimensions. In step 716, the results of this process are used to update the confidence information pertaining to each bit of the recreated N-dimensional structure.

In step 718, the decoder 212 may repeat steps 712-716 until an iteration condition is satisfied, each time passing the improvements in confidence data between the rows of each of N-dimensions. It is this iteration that gives rise to the use of the term "turbo" in turbo product codes. According to an embodiment, the iterations may run a fixed number of times. According to other aspects, the iterations may be terminated based on certain conditions being satisfied. For example, process 706 may be terminated if all soft probabilities satisfy a prefixed threshold. Alternatively, the algorithm may compute a metric at each iteration and if the difference between successive metric values is below a prefixed threshold, then the process 706 is terminated, according to another embodiment. Similarly, according to one aspect, the process 706 may terminate if the average change in soft probabilities between successive iterations falls below a prefixed threshold.

The discussion of impaired carrier coding thus far has focused on achieving error free communication despite the loss of a carrier in a multicarrier communication link without any consideration of noise sources affecting other carriers. In fact, error free communication may only be accomplished if the noise levels affecting the non-impaired channels are within certain limits. For example, in the 2D and 3D TPC examples of FIGS. 5a and 5b, respectively, if a carrier is impaired such that all of the bits conveyed by the carrier are erased, all of the redundancy associated with the first-dimension rows may be consumed in order to restore the erased bits, leaving only the row redundancies of the other dimensions. The two-dimensional 4×8 code of FIG. 5a may effectively be reduced to a one-dimensional code (in this case an (8, 7) simple parity code). The error correcting properties of this 1D code are much weaker than for the original two-dimensional (32, 21) product code. Error free communication may still be possible, however, as long as the overall noise level does not exceed the system's signal to noise ratio (SNR) margin.

Communication systems are often configured to have a SNR margin to tolerate minor noise degradations that occur from time to time. In satellite communications systems this may be referred to as "rain margin" For ICC to support error free communication with one or more impaired carriers, the reduction in coding gain, which occurs when one or more carriers are impaired (effectively eliminating one or more dimension of the multidimensional TPC) may not exceed the rain margin. It may be said that the loss of a carrier consumes part of the rain margin. As a result, if some other impairment (e.g. rain, stormy weather, etc.) occurs when one or more carriers are also impaired (e.g. by an interfering carrier), then bit errors may occur.

Figure 8:
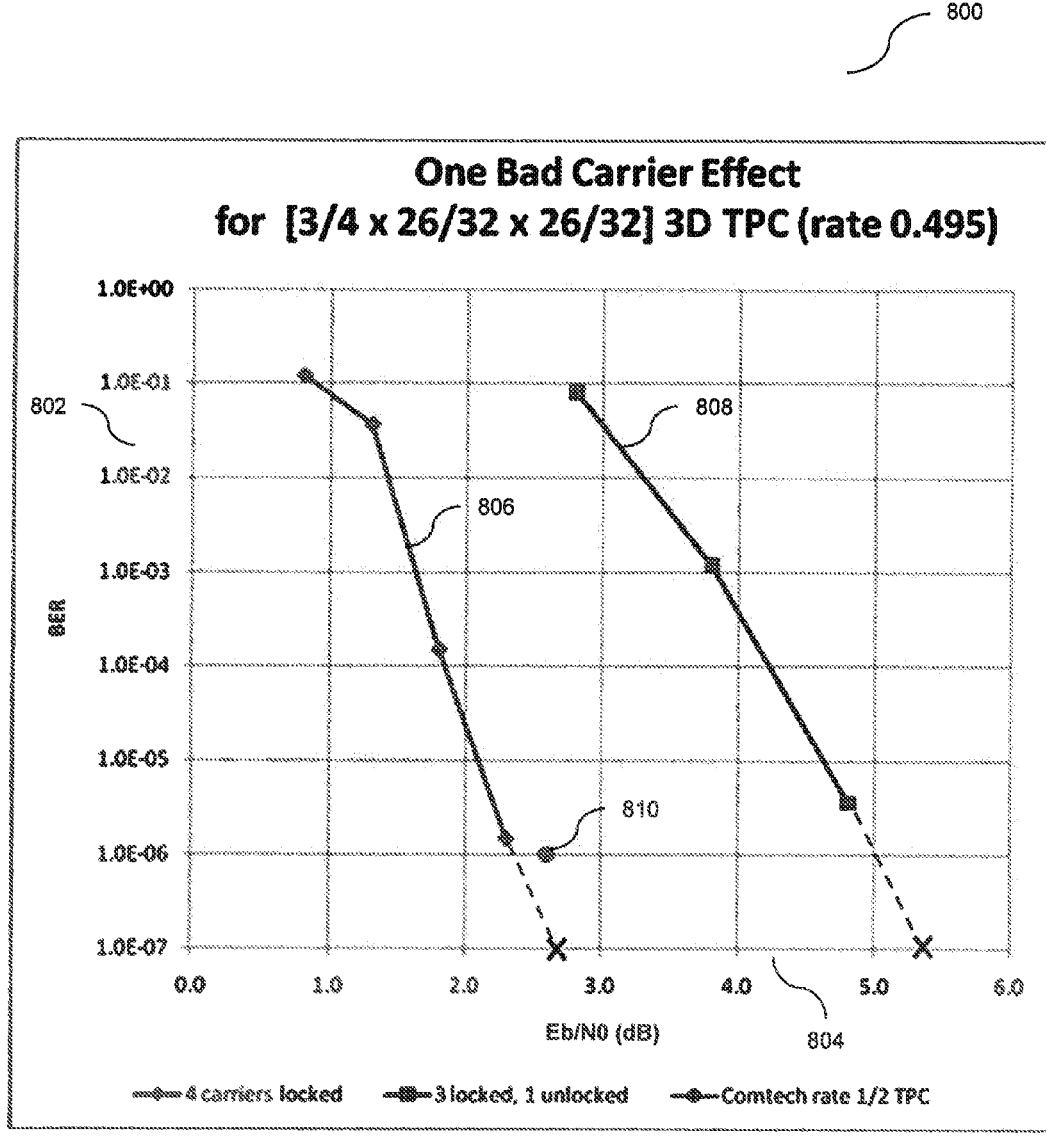
FIG. 8 is an exemplary graph illustrating the simulated effect of noise on the bit-error rate of a 3×32×32 TPC under a normal operating condition and a carrier impairment condition, according to one embodiment of the present invention.

FIG. 8 is an exemplary graph illustrating the simulated effect of noise on the bit-error rate of the 3D TPC of FIG. 5b under a normal operating condition and a carrier impairment condition, according to one embodiment of the present invention.

The 4×32×32 TPC of FIG. 5b is encoded with a (4, 3) simple parity code along the first dimension and (32, 26) extended Hamming code along the second and third dimensions. This results in an overall code rate of approximately ½ (3/4×26/32×26/32). Assuming all carriers have equal data rates, the code may satisfy the ICC criteria if at least four carriers are used.

As in the example of FIG. 5b, when one of the four carriers is impaired, the (4,3) simple parity code of the first dimension may be able to recover the erased bits. With one carrier impaired, the code is reduced to a 32×32 2D TPC code. The code rate of this 2D sub-code is 26/32*26/32=2/3 and the codeword size is 32*32=1024. The code rate and codeword size are similar to commonly used TPC configurations, and the simulation result of FIG. 8, confirms that the sub-code performs well, as expected.

The simulator TPC decoder is configured to accept soft decision inputs. The impaired carrier is simulated by setting the soft decision values for the corresponding bits to the midway point between 0 and 1 (in effect, indicating that the impaired bits are completely unreliable and should be ignored). The X-axis 802 of graph 700 represents the energy per payload bit to noise power spectral density ratio (or SNR per bit) and the Y-axis 804 represent the overall bit-error rate of the multi-channel communication system in logarithmic scale. As previously state, a BER of $10^{-7}$ may be considered "error free." In FIG. 8, the proximity of a data point to the lower left hand corner of the graph is an indication if its closeness to ideal system performance.

Curve 806 simulates the performance of the 3D TPC under normal circumstances (i.e. no impaired carriers). For reference purposes, the typical performance for a rate ½ TPC (at BER $10^{-6}$) of a successful commercial modem, Comtech CDM-600 (datasheet available at http://www.comtechefdata.com/files/datasheets/ds-cdm600-6001.pdf), is shown with the dot 810. The curve 808 simulates the bit error rate of the ICC system when one carrier is impaired. It should be noted that for purposes of this graph, the definition of Eb/NO does not change as a result of one carrier being impaired. Conceptually, the simulation is configured for a given Eb/NO assuming all four carriers have the same SNR. The BER for the given Eb/NO is measured and plotted as curve 806. Then, without changing the noise level, the bits for one carrier are erased. The BER is then measured and plotted as curve 808 at the same Eb/NO. It can be observed that the loss of one carrier causes a degradation of approximately 2.5 dB. Since the typical rain margin in satellite systems is 5-7 dB we may conclude that error free operation is possible when one carrier is impaired (albeit with less margin). It may also be observed that the slope of the BER curve is lower (i.e., BER curve is less steep) when one carrier is impaired. This may be intuitively reasonable because the effective code (the 2D sub-code) is only ¼ the length of the original 3D code.

What is claimed is:

1. A method of transmitting a plurality of bits via at least two carriers for achieving transmission despite an impaired carrier, each of the at least two carriers having a data rate, the method comprising:
   receiving the plurality of bits for transmission via the at least two carriers;
   populating the plurality of bits in a N-dimensional bit structure having N dimensions using an aggregation pattern, the N-dimensional structure having a plurality of rows along each of the N dimensions, wherein N is an integer greater than 1;
   encoding each of a plurality of rows along each of the N dimensions using one of a plurality of codes to generate groups of encoded bits corresponding to the N dimensions, and appending each of the groups of encoded bits to a corresponding dimension of the N-dimensional structure to produce a coded transmit block having N dimensions, a plurality of encoded rows, and a plurality of encoded bits;
   assigning each of the plurality of encoded bits to each of the at least two carriers; and
   transmitting the plurality of encoded bits via the at least two carriers.

2. The method of claim 1, wherein the N-dimensional bit structure comprises:
   a plurality of rows comprising a plurality of first rows extending along a first dimension and a plurality of Nth rows extending along a Nth dimension.

3. The method of claim 1, wherein N equals the integer 3.

4. The method of claim 1, wherein the one or more codes include at least one of an odd-parity code, an even-parity code, a Bose, Chaudhuri, Hocquenghem (BCH) code, a triple modular redundancy, a hamming code, an extended hamming code, a binary Golay code, an extended binary Golay code, or any generalized code based thereon for multiple error correction.

5. The method of claim 1, wherein the data rate of each of the at least two carriers is the same.

6. A method of transmitting a plurality of bits via at least two carriers each having a data rate for achieving transmission despite an impaired carrier the method comprising:
   receiving the plurality of bits for transmission via the at least two carriers;
   populating the plurality of bits in a N-dimensional bit structure using an aggregation pattern;
   producing a coded transmit block having N dimensions, a plurality of encoded rows, and a plurality of encoded bits by encoding N-dimensional bit structure;
   assigning each of the plurality of encoded bits to each of the at least two carriers; and
   transmitting the plurality of encoded bits via the at least two carriers,
   wherein the N-dimensional bit structure comprises N dimensions, a plurality of rows comprising a plurality of first rows extending along a first dimension, and a plurality of Nth rows extending along a Nth dimension,
   wherein encoding the N-dimensional bit structure comprises:
      encoding each of the plurality of first rows using a first code, producing a first group of code bits, and appending the respective ones of the first group of code bits to each of the plurality of first rows; and
      encoding each of the plurality of Nth rows using a Nth code producing a Nth group of code bits and appending the respective one of the Nth group of code bits to each of the plurality of Nth rows, wherein the coded transmit block has a first coded length along the first dimension that is less than or equal to the number of the at least two carriers, and a Nth coded length along the Nth dimension, wherein each of the plurality of encoded bits is associated with a plurality of coded indices comprising an index1 representing a position of each of the plurality of encoded bits along the first dimension relative to an origin and an indexN representing a position of each of the plurality of encoded bits along the Nth dimension relative to the origin.

7. The method of claim 6, wherein assigning each of the plurality of encoded bits comprises:
retrieving each of the plurality of encoded bits by:
first retrieving one of the plurality of encoded bits with index1 equal to I-1 and indexN equal to I-N;
incrementing the index1 by 1 every time each of the encoded bits is retrieved; and
incrementing the indexN when an index immediately preceding indexN exceeds a previous coded length and resetting all of the plurality of coded indices that precede the indexN to 1, until the indexN exceeds the Nth coded length; and
assigning each of the plurality of retrieved bits to each of the at least two carriers based on an assignment sequence.

8. The method of claim 7, wherein the assignment sequence is based on at least one of a number of parameters including:
the number of the at least two carriers;
the data rate of each of the at least two carriers;
the number N; and
a length of each of the N dimensions.

9. The method of claim 7, wherein I-1, and I-N each correspond to the integer 1.

10. A method of transmitting a plurality of bits via at least two carriers each having a data rate for achieving transmission despite an impaired carrier the method comprising:
receiving the plurality of bits for transmission via the at least two carriers;
populating the plurality of bits in a N-dimensional bit structure using an aggregation pattern;
producing a coded transmit block having N dimensions, a plurality of encoded rows, and a plurality of encoded bits by encoding N-dimensional bit structure;
assigning each of the plurality of encoded bits to each of the at least two carriers; and
transmitting the plurality of encoded bits via the at least two carriers, wherein assigning each of the plurality of encoded bits further comprises:
initializing a bit pressure counter of each of the at least two carriers;
initializing a bit-from-row counter of each of the at least two carriers; and
for each of the N dimensions of the coded transmit block:
sequentially identifying a row from the plurality of encoded rows; and
for each identified row:
sequentially identifying a bit from the plurality of encoded bits;
for each identified bit:
reinitializing the bit-from-row counter of each of the at least two carriers;
augmenting the bit pressure counter of each of the at least two carriers by an amount based on the data rate of each of the at least two carriers;
selecting a carrier from the at least two carriers having a highest bit pressure counter and the bit-from-row counter not exceeding a correctable number of bits of the identified row;
assigning the bit to the selected carrier;
decreasing the bit pressure counter of the selected carrier by a predetermined amount; and
incrementing the bit-from-row-counter of the selected carrier; and
reinitializing the bit-from-row counter of each of the at least two carriers.

11. A method of receiving a plurality of bits from at least two carriers each having a data rate for achieving transmission despite an impaired carrier, the method comprising:
sequentially receiving each of the plurality of bits from each of the at least two carriers based on the data rate of each of the at least two carriers;
populating a coded receive block having N dimensions with the plurality of bits;
identifying a group of code bits along each of the N dimensions;
extracting the groups of code bits from the coded receive block producing a N-dimensional bit structure; and
unpopulating the N-dimensional bit structure using an aggregation pattern applied at a transmitter to populate a N-dimensional bit structure,
wherein the N dimensions of the coded receive block further include a first dimension and a Nth dimension,
wherein the coded receive block further comprises a plurality of bit positions, a first coded length along the first dimension that is less than or equal to the number of the at least two carriers, and a Nth coded length along the Nth dimension,
wherein each of the plurality of bit positions is associated with one of a plurality of coded indices including an index1 representing a position of each of the plurality of bit positions along the first dimension relative to an origin, and an indexN representing a position of each of the plurality of bit positions along the Nth dimension relative to the origin.

12. The method of claim 11, wherein populating the coded receive block further comprises:
first populating a bit position with index 1 equal to I-1, and indexN equal to I-N;
incrementing the index1 by 1 every time each of the plurality of bit positions is populated; and
incrementing the indexN when an index immediately preceding indexN exceeds a previous coded length and resetting all of the plurality of coded indices that precede the indexN to 1, until the indexN exceeds the Nth coded length.

13. The method of claim 11, further comprising applying soft detection to each of the plurality of bits.

14. The method of claim 11, further comprising applying a soft-in, soft-out decoding process to the plurality of bits.

15. The method of claim 14, wherein the soft-in, soft-out decoding process is substantially similar to any one of a Chase algorithm, Soft output Viterbi Algorithm (SOVA) or BCJR.

16. The method of claim 11, further comprising performing bit error correction based on a plurality of codes applied along each of the N dimensions by a transmitter using the respective group of code bits.

17. The method of claim 12, wherein I-1, and I-N each correspond to the integer 1.

18. A system having a transmitter and a receiver for transmitting and receiving a plurality of bits via at least two carriers for achieving communication despite an impaired carrier the system configured to:

receive the plurality of bits for transmission via the at least two carriers;

populate the plurality of bits in a first N-dimensional bit structure having N dimensions using an aggregation pattern, the first N-dimensional structure having a plurality of rows along each of the N dimensions, wherein N is an integer greater than 1;

encoding each of a plurality of rows along each of the N dimensions using one of a plurality of codes to generate groups of encoded bits corresponding to the first N dimensions, and appending each of the groups of encoded bits to a corresponding dimension of the first N-dimensional structure to produce a coded transmit block having N dimensions, a plurality of encoded rows, and a plurality of encoded bits;

assign each of the plurality of encoded bits to each of the at least two carriers;

transmit the plurality of encoded bits via the at least two carriers;

sequentially receive each of the plurality of encoded bits from each of the at least two carriers based on the data rate of each of the at least two carriers;

populate a coded receive block having N dimensions with the plurality of encoded bits;

identify a group of code bits along each of the N dimensions;

extract the groups of code bits from the coded receive block producing a second N-dimensional bit structure; and unpopulate the second N-dimensional bit structure using the aggregation pattern.

* * * * *